(12) United States Patent
Ramsay et al.

(10) Patent No.: US 7,395,445 B1
(45) Date of Patent: Jul. 1, 2008

(54) CONTROLLER FOR POWER SUPPLIES

(75) Inventors: Colin Scott Ramsay, Edinburgh (GB);
Graham J. McCorkell, Edinburgh (GB); Roger Charles Peppiette, Edinburgh (GB)

(73) Assignee: Analog Devices, Inc., Norwood, MA (US)

( * ) Notice: Subject to any disclaimer, the term of this patent is extended or adjusted under 35 U.S.C. 154(b) by 434 days.

(21) Appl. No.: 10/811,113

(22) Filed: Mar. 26, 2004

(51) Int. Cl.
*G06F 1/28* (2006.01)
*G06F 1/26* (2006.01)
*G06F 12/16* (2006.01)
*G06F 11/30* (2006.01)
*G11C 5/14* (2006.01)

(52) U.S. Cl. ............... 713/340; 713/300; 713/330; 713/310; 365/228; 365/226

(58) Field of Classification Search ............... None
See application file for complete search history.

(56) References Cited

U.S. PATENT DOCUMENTS

| | | | | |
|---|---|---|---|---|
| 3,626,427 A | * | 12/1971 | MacSorley et al. | 712/244 |
| 5,552,978 A | * | 9/1996 | Moncorge | 363/89 |
| 5,742,624 A | * | 4/1998 | Irie et al. | 714/799 |
| 6,879,139 B2 | * | 4/2005 | Brown et al. | 323/299 |
| 2004/0217750 A1 | * | 11/2004 | Brown et al. | 323/299 |

* cited by examiner

*Primary Examiner*—B. James Peikari
(74) *Attorney, Agent, or Firm*—Wolf, Greenfield & Sacks P.C.

(57) ABSTRACT

A state machine implemented controller is provided in which a logic core 20 is reconfigurable in response to state data held within a memory 22. Thus, on transition from one state to a next state the data held within the memory 22 is used to reconfigure the operation of the logic core 20. This enables a relatively compact logic core 20 to be used time and time again, thereby avoiding the need to individually define a logic core appropriate to each individual one of the states that the state machine can enter into. This results in a controller which is much more compact on an integrated circuit die than is the case with prior art controllers.

49 Claims, 8 Drawing Sheets

| PDO Outputs | IDLE1 | IDLE2 | EN3V3 | EN2V5 | DIS3V3 | DIS2V5 | PWRGD | FSEL1 | FSEL2 |
|---|---|---|---|---|---|---|---|---|---|
| PDO1 = 3V3ON | 0 | 0 | 1 | 1 | 0 | 1 | 1 | 1 | 1 |
| PDO2 = 2V5ON | 0 | 0 | 0 | 1 | 0 | 0 | 1 | 1 | 1 |
| PDO3 = Fault | 0 | 0 | 0 | 0 | 1 | 1 | 0 | 1 | 1 |

| State | End of Step | Timeout | Monitor |
|---|---|---|---|
| IDLE1 | If VX1 is LOW then goto State IDLE2 | | |
| IDLE2 | If VP1 is OK then goto State EN3V3 | | |
| EN3V3 | If VP2 is OK then goto State EN2V5 | If VP2 is NOT OK after 10ms then goto State DIS3V3 | If VP1 is NOT OK then goto State IDLE1 |
| DIS3V3 | If VX1 is HIGH then goto State IDLE1 | | |
| EN2V5 | If VP3 is OK then goto State PWRGD | If VP3 is NOT OK after 20ms then goto State DIS2V5 | If VP1 or VP2 is NOT OK then goto State FSEL2 |
| DIS2V5 | If VX1 is HIGH then goto State DIS3V3 | | |
| FSEL1 | If VP3 is NOT OK then goto State DIS2V5 | | If VP1 or VP2 is NOT OK then goto State FSEL2 |
| FSEL2 | If VP2 is NOT OK then goto State DIS3V3 | | If VP1 is NOT OK then goto State IDLE1 |
| PWRGD | If VX1 is HIGH then goto State DIS2V5 | | If VP1 or VP2 or VP3 is NOT OK then goto State FSEL1 |

FIG. 8

CONTROLLER FOR POWER SUPPLIES

FIELD OF THE INVENTION

The present invention relates to a controller and to a power supply monitoring and sequencing system including such a controller.

BACKGROUND OF THE INVENTION

Complex electrical circuits and systems may involve the provision of a plurality of power supplies. Each power supply may operate at a different voltage and/or supply a different load. It is advantageous during the powering up and powering down of such a complex system that the power supplies can be switched on and off in a predetermined sequence in order to ensure reliable and consistent operation of the electrical system. It is also advantageous to be able to monitor the continued operation of the various power supplies in order to determine that they are well behaved, and in the event of one or more supplies becoming faulty, to be able to take an appropriate action in order to ensure the well being or continued operation of the system served by the various power supplies, or alternatively to shut it down in a manner liable to cause the least disruption or damage to that system.

SUMMARY OF THE INVENTION

According to a first aspect of the present invention there is provided a controller comprising:
 a logic core having a plurality of inputs and a plurality of outputs; and
 a memory;
 wherein the controller functions as a state machine and upon the transition from a state to a succeeding state the operation of the logic core is modified in accordance with data held in the memory.

It is thus possible to provide a controller which has a logic core comprising a relatively small number of components, but where the functionality implemented by the logic core can be modified for each one of the states of the state machine. Given that a state machine can only be in a single state at a time, this is exploited to enable the logic core to be reconfigured upon the transition from one state to another state thereby ensuring that the same logic core is reused time and time again, but in a different way, in order to implement the various states defined within the state machine. This is advantageous because implementing multiple states in fixed function logic would be relatively bulky within an integrated circuit. Implementing a controller which implements a single state at a time plus a memory (memory can be very compact) means that the controller according to the present invention takes up a much smaller footprint within the die of an integrated circuit. Furthermore given that the controller is implemented as a state machine and the various states are held within memory, then the state definitions and hence functionality of the controller can be easily modified. This is advantageous as it enables users of the controller to tailor its functionality to their own requirements.

Preferably the logic core comprises an OR based combinational unit which may, for example, be used as a fault detector. The logic core may also comprise other elements.

Advantageously the fault detector has a plurality of inputs and a lesser number of outputs. Preferably the fault detector has a single output. Thus the fault detector may monitor a plurality of input conditions, and only give a single bit output indicating that a fault has detected, but does not indicate which of the conditions it is monitoring, or indeed devices it is monitoring, has given rise to the fault.

Preferably the inputs of the fault detector are combined by combinational logic. Advantageously one or more inputs of the fault detector are associated with a respective input detector which is responsive to a first control signal which functions as a mask or select signal to determine whether the input to the input detector should be taken into consideration by the fault detector.

Preferably each input detector is also responsive to an associated second control signal for determining whether the input detector works in a non-inverted or an inverted mode. In an inverted mode the presence of a fault condition can be determined by the input to the input detector being at a logical zero instead of a logical 1, and the occurrence of a fault is indicated by the output of the fault detector being at a logical 1. The inversion can be achieved by inverting the input or the output of the input detector in response to the second control signal. The inversion can be achieved by the use of a exclusive OR gate in a manner which is well known to the person skilled in the art.

Optionally an input detector circuit may be responsive to a plurality of inputs. Such a detector may be arranged, for example, to monitor the order of events occurring at its inputs. Advantageously each input of the multi-input detector circuit is associated with its own invert control and/or mask/select control.

Preferably the outputs of the respective input detectors are provided to the combinational logic within the fault detector for combining them to derive a single bit output. Preferably the combinational logic is an OR gate. Advantageously the output of the OR gate may be supplied to an output circuit which can output the signal from the OR gate in a non-inverted form or an inverted form, as selected by a invert control signal. This functionality can be implemented by an exclusive OR, XOR, gate having a first input connected to the output of the OR gate and a second input connected to the invert signal. This, in combination with the invert signals supplied to the individual input detectors allows the inputs of the fault detector to be combined in a logical OR or as a logical AND. This is appropriate as a user may wish to assert a signal that the supplies are healthy rather than asserting that one or more supplies has gone into a fault state.

Preferably the logic core comprises a sequence detector. The sequence detector has a plurality of inputs and a lesser number of outputs. Advantageously the sequence detector has only a single output.

Advantageously the sequence detector is arranged to monitor only one of its inputs, as selected by a control word, and to assert an output when the selected input has been in a predetermined state for a predetermined period of time. Preferably the selection of the input is performed by a multiplexer in response to a selection control word.

The predetermined state is advantageously a logical state, that is a signal having a high or a low value. The predetermined state can be defined by having a switchable inverter at the output of the multiplexer thereby enabling the output of the sequence detector to be set, for example to a logical 1, irrespective of whether the predetermined state corresponds to the input being a logical zero or a logical 1. The switchable inversion can, once again, be implemented using an exclusive OR gate. The XOR gate has one of its inputs connected to the output of the multiplexer, and another one of its inputs connected to receive the "invert" signal.

Advantageously a timer is responsive to the output of the multiplexer and is arranged to assert its output only when it has determined that the signal supplied to it, and hence the input condition monitored by the sequence detector, has been satisfied and remained unchanged for the predetermined time period. The predetermined time period is advantageously programmable and can be varied from one state to the next.

Preferably the logic core comprises a time out circuit which asserts a signal after a predetermined time period has elapsed. Advantageously the time period is measured from the entry into the current state of the state machine and is individually programmable for each of the states. However in a preferred implementation of the present invention the time out circuit only measures or counts time while the condition being monitored by the sequence detector is not satisfied. This subtle change in operation is quite beneficial. It therefore becomes possible to set the timer of the sequence detector to count a relatively long delay, for example 100 ms, after a condition monitored by the sequence detector has occurred before forcing a jump to the next state. However, it is also possible in this arrangement to define that a fault condition exists if the condition monitored by the sequence detector has not been satisfied within a shorter period, for example 10 ms, and thereby to force a jump to an appropriate next state.

In an embodiment of the present invention the minimum delay is 0.1 ms and the maximum delay is set to 400 ms. However it would be equally feasible to have a shorter, for example zero minimum delay, and a different maximum delay.

Preferably the memory holds data defining each state of the state machine. A state machine, as is known to the person skilled in the art, progresses from one state (a first state) to another state (a second state) based on the conditions prevailing in the first state. The advantage of a state machine is that all possible states that it can be in can be fully defined. This gives a state machine predictability and controllability compared to implementing the same functionality within a programmable data processor. The order in which events may occur, the possibility of interrupts and uncertainties in the process of writing computer programs means that inherently there tend to be states which are ill defined and which could give rise to a fault condition or failure of the computer program to control devices properly. Preferably the memory is re-programmable and non volatile. Thus users can write their own control sequences to the memory.

The state data for any given state is held within the memory and, advantageously, may be thought as comprising a state control word. The control word may be spread across several bytes and indeed may be read out from memory by reading the bytes sequentially in order to reconstruct the entire state control word. The state control word may comprise one or more of the following:

output data defining the condition of one or more outputs of the controller upon entry into a given state;

data for controlling operation of the fault detector and in particular data defining for each input of the fault detector whether that input is to be selected or ignored, optionally data for each input of the fault detector defining whether the input is to be treated in an inverted form or not, that is to say data indicating whether a fault condition is to be asserted if the input is zero, or if the input is one; and the address or identifier of the next state to be entered in the event that a fault condition is flagged;

data for controlling the sequence detector and in particular data identifying which one of the inputs of the sequence detector should be monitored, optionally data defining whether the sequence detector is to work in an inverted mode or not (i.e., whether the input to the sequence detector should be high or low) in order to indicate that a step in the sequence had been completed; and an indication of the time period for which the condition monitored by the sequence detector must remain true in order for an output to be asserted; and for state machines having a time out circuit an indication of the duration of the time period that the timer will count for.

The state control word may also comprise bits for controlling or enabling other features of the logic core. Thus, in an embodiment of the present invention a "fault" latch is provided which can latch and hold the input states of the fault detector in response to a latch signal asserted by the logic core. Whether this signal is asserted or not is defined in the state control word.

BRIEF DESCRIPTION OF THE DRAWINGS

The present invention will further be described, by way of example, with reference to the accompanying drawings, in which:

FIG. 8 is a table showing state names and events that the logic core monitors in an example power supply control sequence;

DESCRIPTION OF PREFERRED EMBODIMENTS

Figure 1:
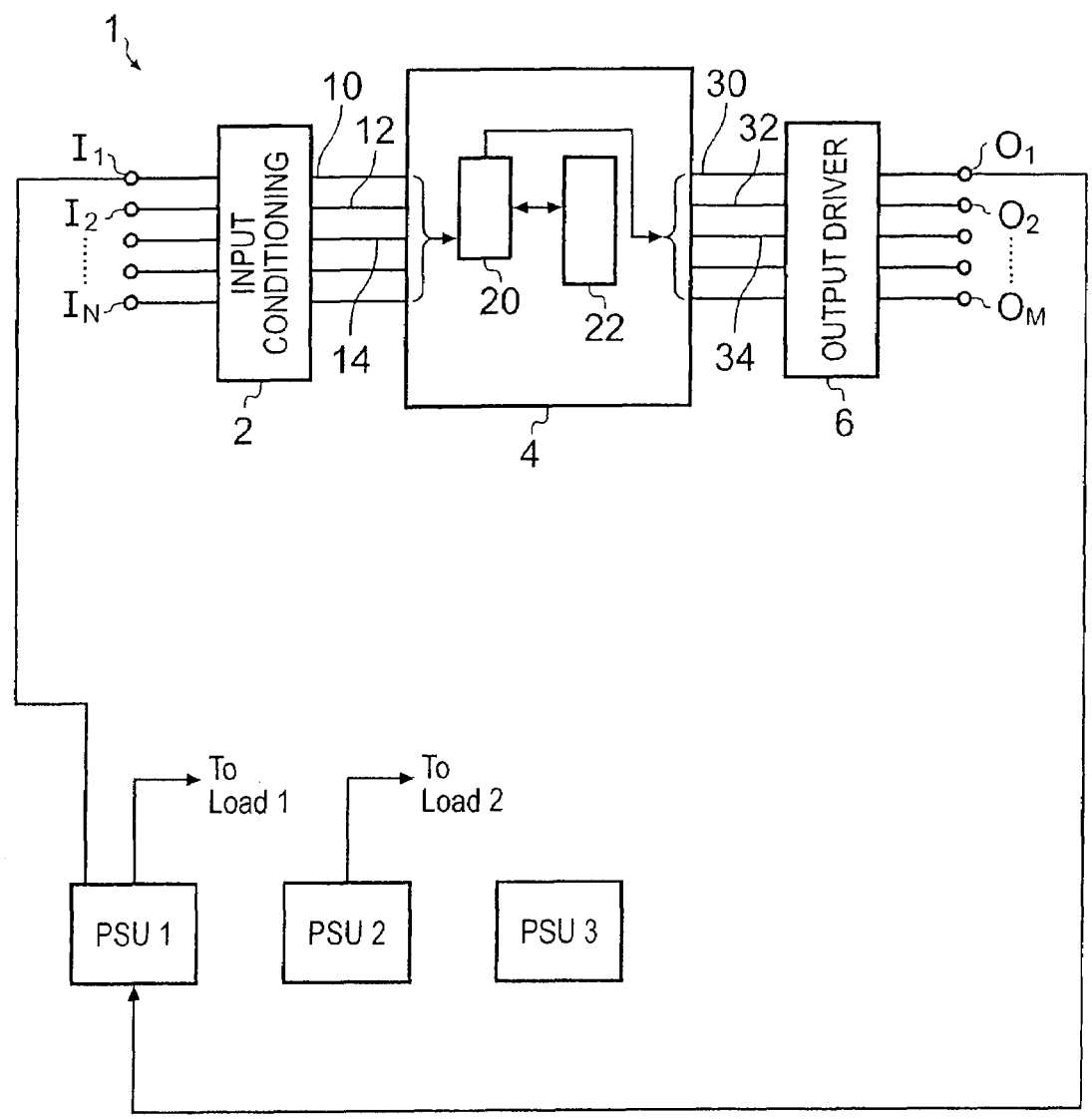
FIG. 1 schematically illustrates a power supply controller constituting an embodiment of the present invention.

FIG. 1 schematically illustrates a power supply controller for controlling a plurality of power supplies PSU1 to PSU3 and constituting an embodiment of the present invention. The power supply controller, generally indicated 1 comprises an input conditioning stage 2, a controller 4 and an output driver 6. The input conditioning stage 2 has a plurality of inputs $I_1$, $I_2$ to $I_N$ which are connected to the power supplies in order to determine various parameters of the supply performance. Thus, for example, input $I_1$ may be connected to the first power supply PSU1 in order to monitor the voltage delivered by that power supply. Similarly, input $I_2$ may be connected to monitor the voltage output by the second power supply PSU2, and a third input might be connected to the third supply PSU3 in order to monitor its output voltage. Similarly other inputs may be connected to respective ones of the supplies in order to monitor the current delivered by those supplies or the temperature of critical components within those supplies. It can be seen that the inputs provide information concerning the operating conditions of the associated power supplies. The input signals $I_1$ to $I_N$ tend, by their very nature to be analog signals. The input stage 2 accepts these analog signals and processes them in order to parameterise or condition the signals and to produce digital outputs representative of whether the corresponding input satisfies a particular condition or parameter. Typically the input stage 2 will include voltage or current comparators which are provided with the reference from a controllable source, such as a digital to analog converter (not shown) thereby enabling the comparator to give a simple digital output, for example of whether the voltage supplied by PSU1 is above a minimum acceptable threshold. Other comparators may be used to perform other tasks, such as indicating whether or not the voltage supplied by PSU1 exceeds a maximum permissible threshold. Further comparators may be configured to perform further tasks. Therefore indications of, for example, whether the current exceeds an acceptable threshold may also be given. Measurements of whether an output stage within the power supply unit has exceeded an acceptable temperature threshold or indeed whether the ripple current on a power supply output has exceeded a threshold may all be determined by comparators or other interface devices within the input interface 2 and output on respective signal paths 10, 12, 14 and so on. Each of the signal paths 10, 12 and 14 is constrained to be either "high" or "low" and consequently each can be thought of as being a single bit binary word. Such interface units 2 are well known to the person skilled in the art and need not be described in detail here. Hitherto, the binary input signals would be processed via a controller 4 comprising a combinational logic block, for example implemented via a programmable logic array. The size of the combinational logic block increases rapidly as the number of inputs and states it has to control or implement increases and it tends to be difficult to design circuits having anything other than relatively simple functionality. Furthermore, since the functionality is determined by the interconnections between the logic elements it is hard wired into the integrated circuit at manufacture and hence does not have the flexibility to be changed by the end user.

The controller of the present invention comprises a logic core 20 which is re-programmable in response to instructions received from a memory 22. The logic core 20 is programmable in the sense that the inputs it responds to and the actions it takes are determined by the content of the memory 22 although the underlying device interconnect a pattern of the gates within the circuit 20 remain, in this example, essentially unchanged. The ability to reconfigure the logic core 20 in response to control data held within the memory 22 means that the logic core 20 can be programmed to implement a state controller within a state machine, and upon the transition from one state to a target state, the details of the functionality of the target state can be read from the memory 22 and used to modify the operation of the logic core 20 such that it then implements the functionality of the target state. In this way, multiple states within a state machine can be represented using the same logic core 20 which is reconfigured upon the exit of the current state to match the requirements of the next, i.e., target, state.

The memory 22 contains, amongst other things, the output signals which are to be asserted by the controller 4 upon entry into any given state. These output signals are output from the logic core 20, and hence from the controller 4, and are fed to the driver circuit 6 which accepts the signals it receives on the signal lines 30, 32, 34 and so on and converts these into control signals $O_1$ to $O_M$ suitable for controlling the power supplies PSU1, PSU2 and PSU3. Thus the driver circuit 6 may perform level shifting and amplitude conversion of the output signals in order to render them into a form suitable to act as control signals for the power supplies. The number of input signals $I_1$ to $I_N$ may be the same as or different to the number of output signals $O_1$ to $O_M$.

Figures 2, 10:
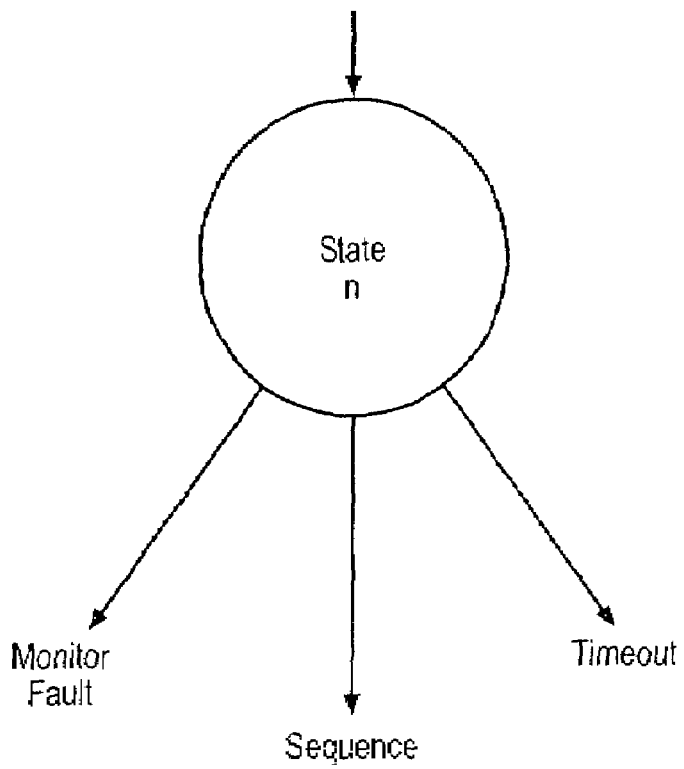
FIG. 2 schematically illustrates the entry and exit paths of a state within the state machine shown in FIG. 1.
FIG. 10 shows the output signals defined for each one of the states in FIG. 8.

The controller 4, as noted hereinbefore, implements the control regime as part of a state machine. A state machine defines a plurality of states that the state machine can enter and the output parameters for each one of the states can be fully defined. In an embodiment of the present invention the state machine as implemented by the logic core 20 and memory 22 define states, which as shown in FIG. 2, notionally have an entrance because they are called by a earlier state, and which also have a plurality of exits. In the example described herein a state may have one, two or three exits. Three is not a limiting number and if further processing units are added within a state machine then further exit routes can be envisaged. In the present invention each state can include a fault monitor, a sequence monitor and a timeout detector (a time out timer) and whichever one of those circuits is triggered first determines the identity of the next state to be executed within the state machine.

Figure 3:
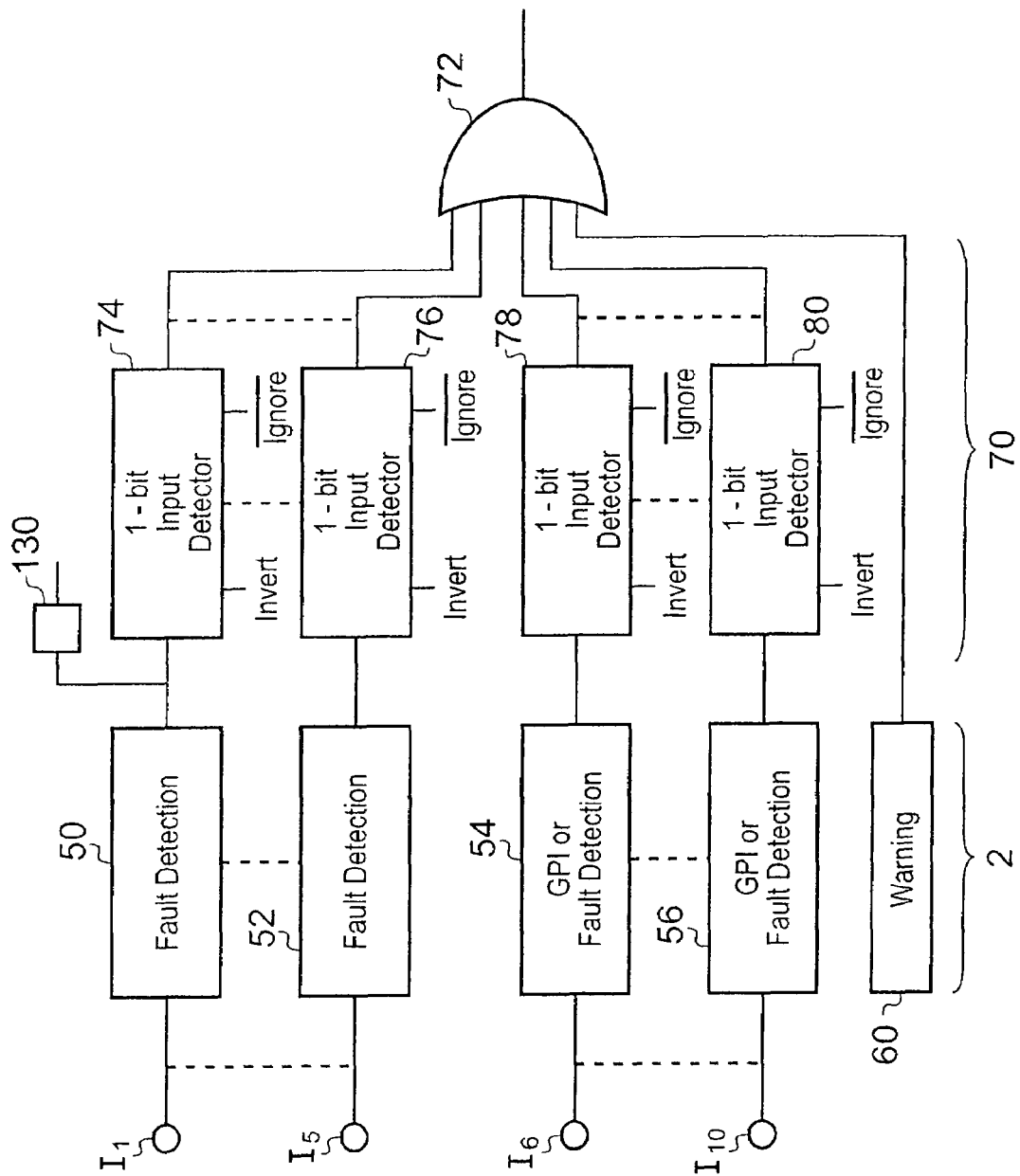
FIG. 3 is a circuit diagram of a fault detector constituting an embodiment of the present invention.

FIG. 3 schematically illustrates an example of a fault detector which may be implemented by the logic core 20. The logic core 20 can also simultaneously implement a sequence detector and a timeout detector/timer.

In order to put the fault detector in context, FIG. 3 also schematically illustrates some of the fault detection circuitry which is effectively implemented within the signal conditioning unit 2. In this diagram ten inputs are provided $I_1$ to $I_{10}$, but only inputs $I_1$, $I_5$, $I_6$ and $I_{10}$ are shown for clarity. Inputs $I_1$ to $I_5$ feed respective conditioning circuits 50 and 52 within the interface unit 2. The conditioning circuits 50 and 52 generally comprise a comparator arranged to compare the input $I_1$ and $I_5$ with a locally generated reference voltage and to output a single bit signal indicating the result of the comparison. The inputs $I_6$ to $I_{10}$ are, in this example, of a different nature to those for inputs $I_1$ to $I_5$ and in particular the signal conditioning circuits 54 and 56 may be more complex and either offer some form of general purpose interface or further fault detection. The precise functionality and construction of the interface circuits depend to a large extent upon specific characteristics of the power supplies that the controller is to control, and the purpose that they will be used for. Therefore, in general, the interface 2 and the circuits within it will be defined and designed by the end user. However each circuit gives a single output which can take only one of two states. The interface circuit may however include a warning block 60 which itself may gather warning signals from further monitoring circuits and simply OR them together so that the assertion of a warning by any of these additional warning circuits will be propagated into the fault detector. The fault detector generally indicated 70 is, as mentioned before, implemented within the logic core 4 and comprises an OR gate 72 having a respective input for each one of the inputs $I_1$ to $I_{10}$. Each input to the OR gate 72 is manipulated by a respective input detector 74, 76, 78 and 80. For simplicity, the operation of only one of the input detectors 74 will be described further.

Figure 4:
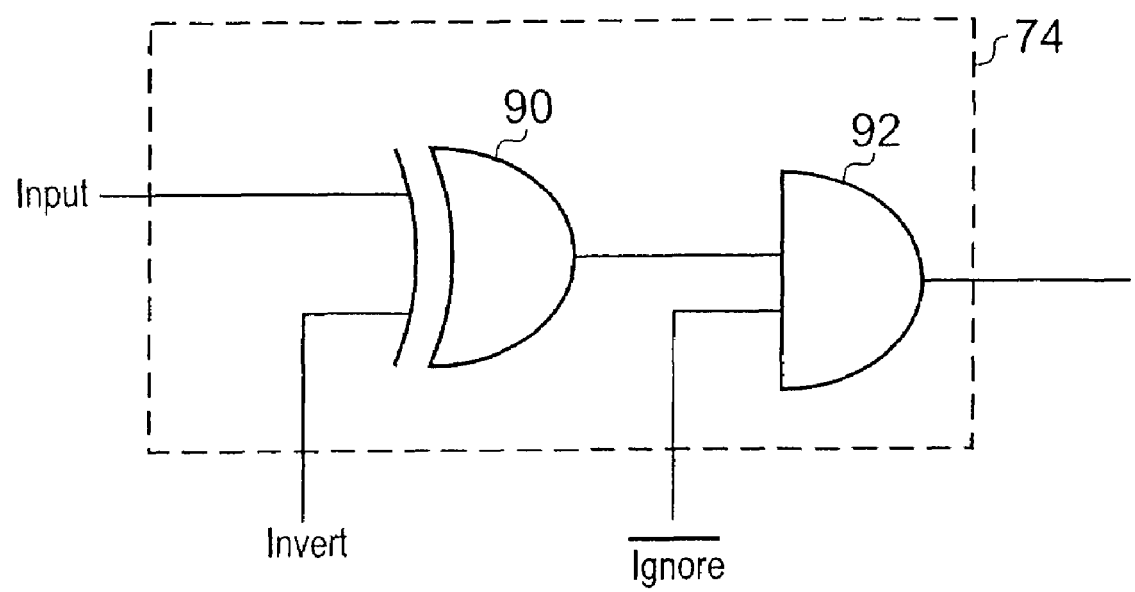
FIG. 4 schematically illustrates a circuit for selectively inverting a signal or passing the signal in a non-inverted state.

In general, a fault may be signalled either by the input to the input detector being in a high (one) or low (zero) condition. Which one of these corresponds to the fault condition is determined by the operation of the interface circuit 50. The interface circuit 50 is designed by the end user and may even be derived from pre-existing equipment and hence it is unwise to make any assumptions about the conventions, that is whether a fault is indicated by the signal being high or whether the fault is indicated by the signal being low, which were implemented by the user or the manufacturer of the interface equipment. Whilst it would be possible to require all users to present the fault signals in standardised format, this is likely to be unpopular with end users and consequently the input detector has a first input labelled "invert" which defines whether the input low or whether the input high represents the fault condition. Of course, a user may not wish to monitor all of the inputs $I_1$ to $I_{10}$ all of the time and hence it is necessary to be able to mask some of the inputs out. Therefore the one bit input detector 74 also has a second input $\overline{\text{ignore}}$ which, when low causes the output of the input detector 74 to be low irrespective of the state of input to the detector 74, but when high enables the output of the one bit input detector 74 to be influenced by the input signal supplied to the one bit input detector 74. This functionality can be achieved, as shown in FIG. 4, by the series combination of an exclusive OR gate and an AND gate. Thus an input signal is provided to a first input of the exclusive OR gate 90 and the invert signal is provided to the second input of the exclusive OR gate 90. An output of the exclusive OR gate is provided to a first input of the AND gate 92. The $\overline{\text{ignore}}$ signal is provided to a second input of the AND gate 92 and the output of the AND gate 92 constitutes the output of the one bit input detector 74.

Figure 5:
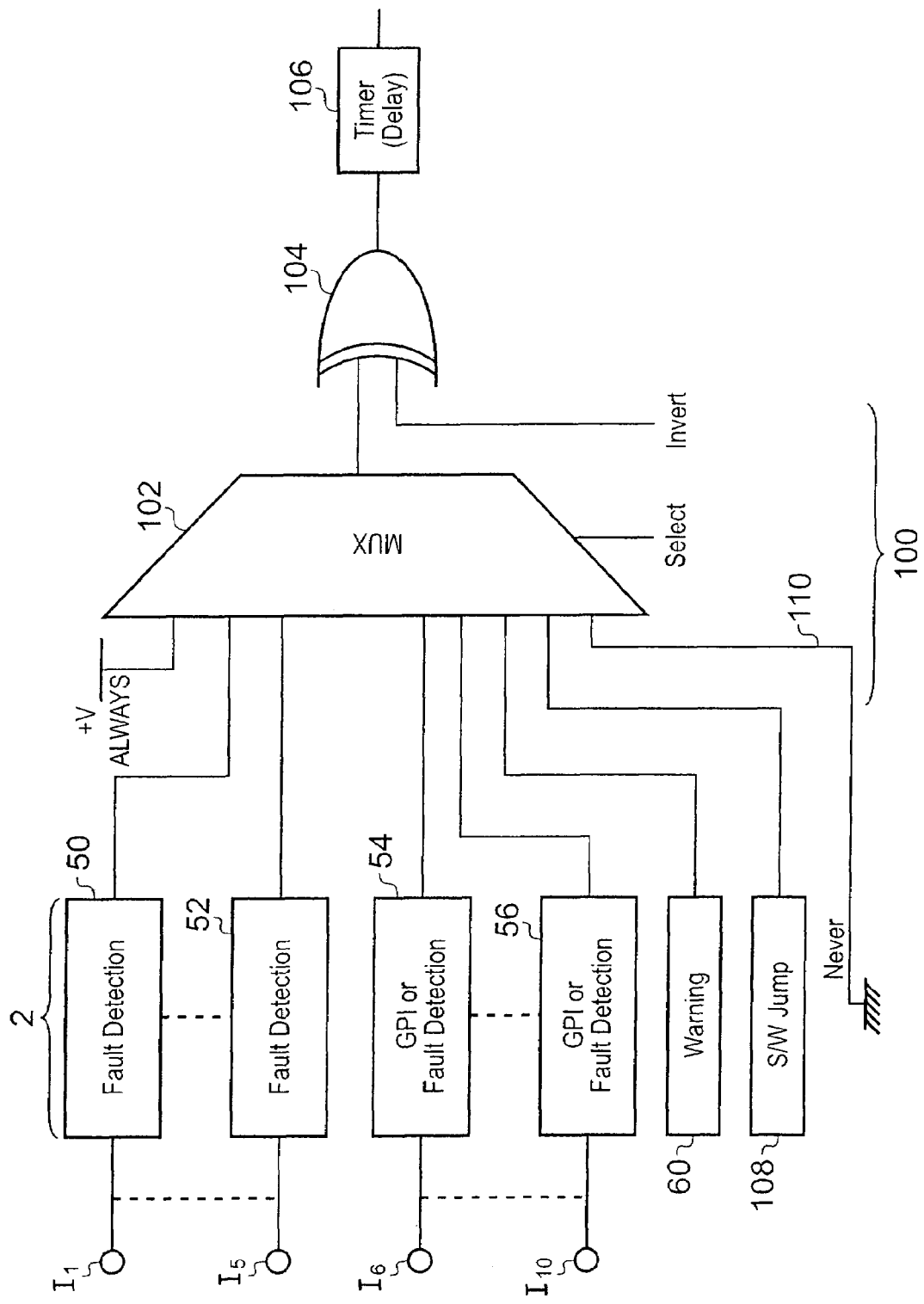
FIG. 5 is a circuit diagram of a sequence detector constituting an embodiment of the present invention.

FIG. 5 schematically illustrates the configuration of a sequence detector, generally indicated as 100 which is implemented within the logic core 20. Inputs $I_1$ to $I_{10}$ (in which only inputs $I_1$, $I_5$, $I_6$ and $I_{10}$ are shown for clarity) are provided by respective signal conditioning circuits 50, 52, 54 and 56 as hereinbefore described with reference to FIG. 3 to the input of the sequence detector. The input of the sequence detector comprises a multiplexer 102 which selects one of its inputs in response to a selection control word and provides the selected input to a first input of an XOR gate 104. A second input of the XOR gate 104 is connected to a invert signal in order to cope with the possibility that the completion of an event may be signalled by the input to the multiplexer going either high or low, depending on the implementation of the circuits 50 to 56. The provision of the invert signal to the XOR gate 104 enables the signal transition or state provided to a timer 106 to be modified to account for this possible inversion of the logic states and thereby ensure reliable operation of the sequence detector irrespective of whether the transition of the monitored input $I_1$ to $I_{10}$ is from low to high or from high to low. It need merely be known in what direction the transition will be or what the desired final signal state will be. The multiplexer 102 has additional inputs which enable it to receive the warning signal 60 or a signal from a latch 108 which is itself controlled by software enabling a computer program executing within a programmable dataprocessor to exert an influence over the state machine implemented within the controller 4. One of the inputs 110 of the multiplexer 102 may be permanently tied to a predetermined voltage, either ground or the positive supply rail which, in combination with the status of the invert signal can be used to ensure that the sequence detector either always provides a signal to the timer 106 or never provides the signal to the timer 106. This choice can be varied for each one of the states of the state machine.

Figure 6:
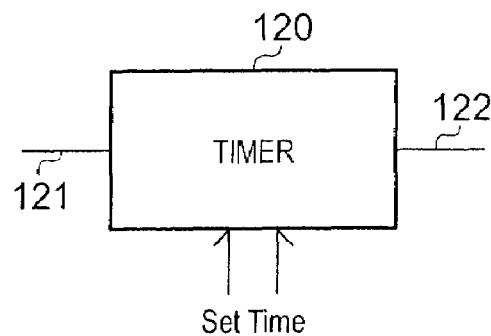
FIG. 6 schematically illustrates a time out timer within the logic core of the controller.

FIG. 6 schematically illustrates the time out function of the logic core. The timer 120 is digitally programmable and has an input 121 which is connected to the output of the XOR gate 104 and hence it has knowledge of whether the condition being monitored by the sequence detector has occurred. If the condition being monitored by the sequence detector has not occurred the timer 120 asserts its output 122 once the pre-programmed time has elapsed. Therefore the time can be used to ensure that another state is entered in the event that no fault condition is located or that no sequence event occurs. It therefore stops the state machine becoming stuck in a state if the event that it is monitoring for does not happen.

Figure 7:
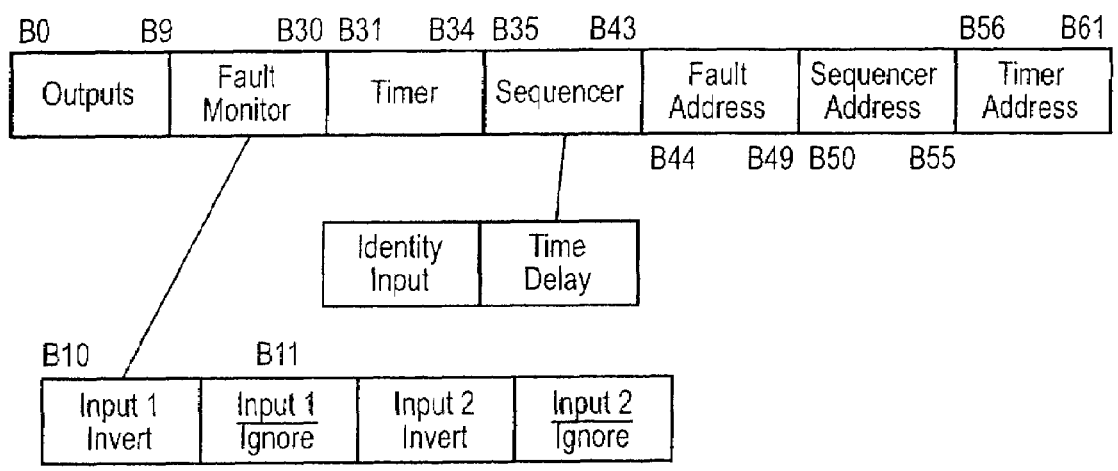
FIG. 7 illustrates an exemplary format of a state control word within the memory.

FIG. 7 schematically illustrates the state control word. A state control word is associated with each individual state. The state control word can be accessed by looking up the memory address which has been pointed to by a previous state. Therefore the state control word does not need to include a state identifier since it is inherent from the position of the state control word within the memory. Put another way, if a 64 bit long state control word were to be stored in a 64 by 64 bit array of memory then the first state control word would be stored at address 1, the second state control word at address 2, the third state control word at address 3 and so on. However for convenience the state control word may be stored in 512 by 8 bit array and hence the start address at the first state control word is address 1, start address of the second state control word is address 9, the start address of the third state control is address 17, and so on. If the memory address sequence starts at address zero, then the start address for each control word is in fact a multiple of 8.

An exemplary control word is shown in FIG. 7. The word comprises 64 bits labelled zero to 63. In the present embodiment the controller has ten outputs so bits zero to nine represent the ten outputs bits which can be individually set or reset by the logic core upon entry into any given state. Bits 10 to 30 control the status of the ten inputs for the fault monitor. Each input has two control bits associated with it indicating whether the input needs inverting, as shown by bit B10, and whether the input should be ignored (i.e., masked) as indicated by bit B11. Bits 31 to 34 define a time delay for the time out timer (as shown in FIG. 6). The four bits define 16 individual delay times, which, in this example, have delays corresponding to 0, 0.1, 0.2, 0.4, 0.7, 1, 2, 4, 7, 10, 20, 40, 70, 100, 200 and 400 ms respectively.

Bits 35 to 49 control the operation of the sequence detector shown in FIG. 5. The sequence detector has 10 inputs $I_1$ to $I_{10}$ plus the warning input, the software jump input, the always input and the never input. These fourteen inputs can be encoded by a four bit input word thereby selecting one of the inputs for use. Furthermore an additional bit can be used to control the invert line on the sequence detector and then another four bits can be used to define the time period in the timer 106 for which an event must be satisfied before an output is asserted. The timer 106 has, for convenience, the same time periods as described hereinbefore with respect to the time out timer function.

As noted hereinbefore, whichever function happens first, either a sequence event occurs, the timer times out, or a fault is detected, controls which is the next state to be executed. Therefore the state control word also needs to define the subsequent states for each of these events occurring. Therefore bits 44 to 49 define the state to be executed next if the fault monitor is triggered. Bits 50 to 55 define the number of the state to be executed next if the sequence detector is triggered, and the bits 56 to 61 define the state to be executed next if the time out timer is the first functional block to assert its output. This leaves two bits, bit 62 and 63 which could be used to control other functions.

In a embodiment of the present invention, bit 63 is used to control a latch which can latch and hold a copy of the input states $I_1$ to $I_{10}$ for subsequent investigation during fault analysis. The latch 130 (FIG. 3) is effectively in parallel with the inputs and hence does not affect the propagation of the input signals to the logic core. Bit 62 is therefore available to initiate other functionality that may be implemented within the integrated circuit having the logic core therein.

Figure 9:
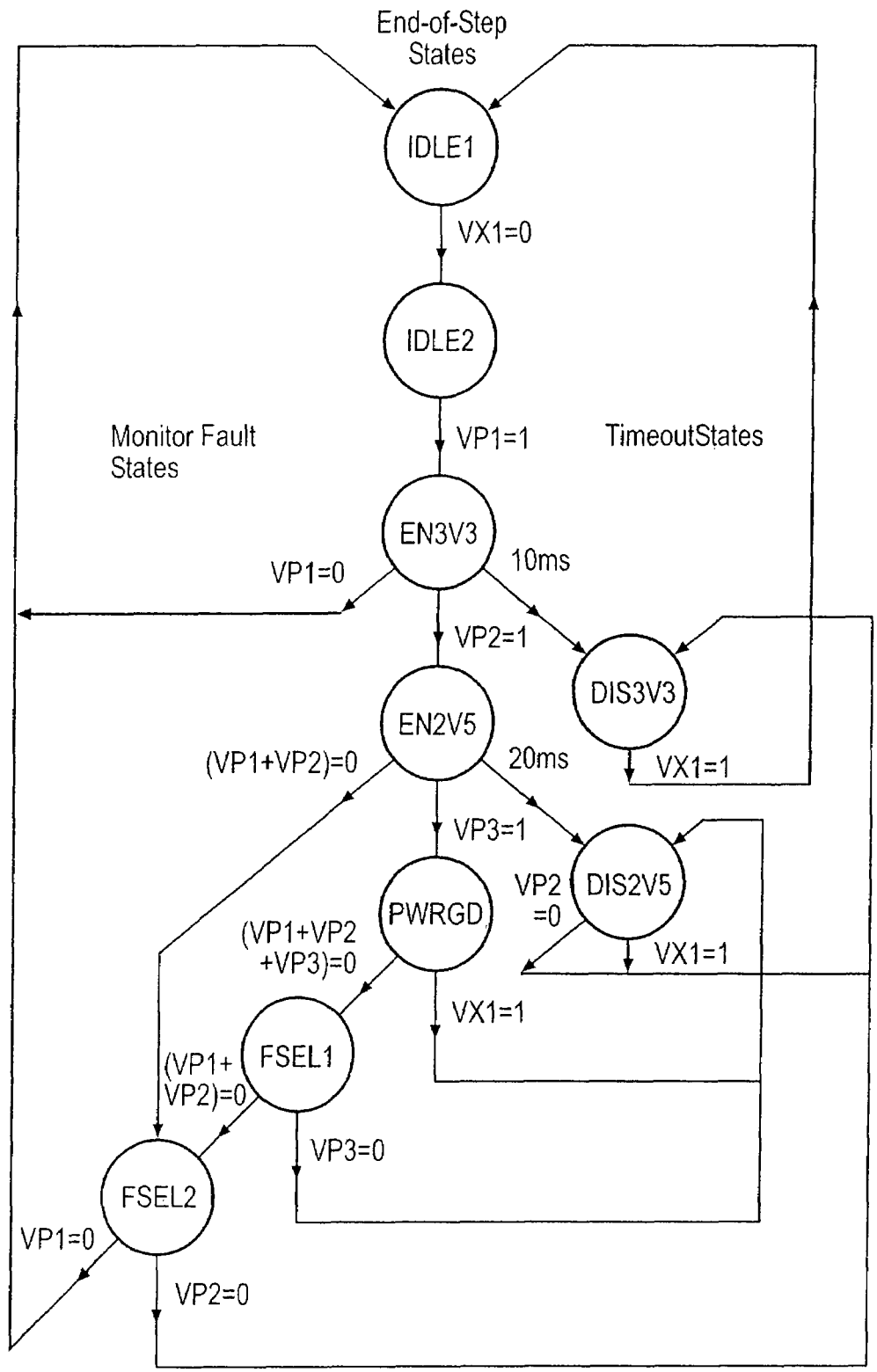
FIG. 9 is a diagram showing state transition paths between the states of FIG. 8.

Suppose, with reference to FIGS. 8, 9 and 10, that we wish to control the power up sequence of three power supplies P1, P2 and P3 and that we monitor the output voltages of these supplies. The output voltages are conditioned by the signal processing circuit such that the input to the logic core comprises a measurement of the first power supply output voltage VP1 which can be in either of two states, namely good or bad. Similarly input signals VP2 and VP3 are provided representative of the output voltages of the power supplies P2 and P3, respectively. The system also has a further input in this example, which is the VX1 pin which may for example correspond to input $I_6$. In this example we are initially intending to look for the presence of a good power supply on VP1. No other events are then to happen until triggered by the VX1 input going low. It is then intended that the sequence will turn on the supply P2 which is a 3.3V power supply and once that is established it will then turn on the supply P3 which is a 2.5V power supply. This sequence of events, the interrelation between the states and the conditions which causes a jump from one state to another are diagrammatically shown in FIGS. 8 and 9. FIG. 8 is a table defining each one of the states and the events that the logic core looks for in that state. FIG. 8 should be read in conjunction with FIG. 10 which is a table defining the outputs $O_1$ to $O_M$ (renamed PDO1 to PDO3 in this example) which occur on the entry into each state. FIG. 9 is a state transition diagram showing the possible progressions from one state to another. The first state in the state machine is state "IDLE1" and as can be seen from FIG. 8, the timeout and fault monitor conditions for this state are not used. Therefore the only event that is monitored is for the input pin VX1 going low. Once this is detected, a jump is made to the state "IDLE 2". State IDLE2 again has no monitor or timeout facilities, and merely waits for the fault detector to confirm that the first power supply VP1 is correct. If the fault detector asserts that VP1 is correct then control is then passed the state "EN3V3" which starts the enablement of the 3.3V power supply. As can be seen in FIG. 9, this state has three possible exit paths. These are shown more clearly in the table in FIG. 8. The first exit condition is defined by the fault detector which checks to see if the power supply voltage of the second power supply is correct (i.e., the output of the second power supply is approximately 3.3V). If this event occurs first then control is passed to state "EN2V5". However, in state "EN3V3" the timeout function is also enabled with a delay of 10 ms. This means that if VP2 has not been asserted as correct within the 10 ms time period, then the timeout function will assert itself and will cause a jump to state "DIS3V3" which asserts an output word which causes the 3.3V supply to be switched off.

State "EN3V3" also sets up its monitoring function, which looks at power supplies which have already been enabled to ensure that they remain good. Thus the fault detector is, in this state, arranged to look at the input VP1 which confirms the health of the first power supply and if this input is not correct then to force a jump to state "IDLE1".

Assuming that we jump to state "EN2V5" we can see that this state also has three exits. We can also see that upon entry to state "EN2V5" we changed the output word of the logic core to enable the 2.5V supply. The sequence detector of state "EN2V5" is arranged to monitor the power supply P3 and if the input signal VP3 is o.k. (indicating that the 2.5V supply has been correctly powered up) then a jump is made to the state "PWRGD". However we can also see that the timeout unit has also been enabled with a 20 ms delay. Consequently, if VP3 has not gone good within 20 ms then a jump will be forced by the timeout unit to state "DIS2V5". The monitor circuit has also been programmed to monitor both VP1 and VP2 and if either of them is not functioning properly then it forces a jump to state "FSEL2".

Assuming from state "EN2V5" that everything is o.k., we will have entered the "PWRGD" state this states two exits. The sequence detector is enabled to monitor the input pin VX1 which used to signal the power up condition, and if this goes high this can be used to indicate the start of a power down sequence. This causes a jump to a state "DIS2V5" in which the 3.3V supply remains on but the 2.5V supply of power supply 3 is switched off. The "PWRGD" state also monitors the inputs VP1, VP2 and VP3 and if either of these is not correct forces a jump to state "FSEL1".

"FSEL1" has two exits it sets up the fault detector to monitor if VP3 is not functioning correctly, and if VP3 is not outputting the correct voltage then a jump is forced to state "DIS2V5" where the enable signal for the 2.5V power supply is removed, thereby switching it off. The state FSEL1 also monitors VP1 and VP2 and if either is not functioning correctly then a jump is made to state FSEL2.

State "FSEL2" has two exits. The fault detector is arranged to look at the output VP2 representing the state of the 3.3V power supply and if VP2 is not outputting the correct voltage then a jump is made to state "DIS3V3" in which the 3.3V power supply is switched off as is the 2.5V power supply. However in state FSEL2 the fault detector unit is also arranged to check the health of power supply VP1 and if this is not o.k. then a jump is made to state IDLE1 in which the 3.3V power supply and 2.5V power supplies are switched off.

If a jump has been made to state "DIS3V3", it could be seen that this step only has one exit which is prompted by the signal on the input pin VX1 going high, thereby forcing a jump to the state "IDLE1".

If the state "DIS2V5" has been entered then it can also be seen that this state only has one exit which is again triggered by the sequence detector noting that input pin VX1 is high, forcing a jump to state "DIS3V3".

As noted before upon entry to each state the output pins are set according to the instructions in the state control word. Thus FIG. 10 shows for each state what the output condition of the logic core is.

It is thus possible to provide a state machine controller capable of implementing complex control algorithms with high reliability whilst also having only a relatively simple and small logic core which takes up only a relatively small area on the semiconductor die and which is reconfigurable in terms of its functionality upon the jump from one state to another state.

The invention claimed is:

1. A controller for a plurality of power supplies, the controller comprising:
   a logic core having a plurality of inputs and a plurality of outputs for supplying signals to control said power supplies; and
   a memory;
   wherein the controller functions as a state machine and upon the transition from a state to a succeeding state the operation of the logic core is modified in accordance with data held in the memory, such that the inputs selected for monitoring by the logic core can be varied as the controller changes state.

2. A controller as claimed in claim 1, in which the logic core represents a state having up to three outputs.

3. A controller as claimed in claim 1, in which the logic core includes a fault detector.

4. A controller as claimed in claim 3, in which the fault detector has a plurality of inputs and a lesser number of outputs.

5. A controller as claimed in claim 4, in which the fault detector has a single output.

6. A controller as claimed in claim 5 in which an output of the fault detector is supplied to a device arranged in a first mode to pass the output of the fault detector in a non-inverted state and in a second mode to invert the output of the fault detector.

7. A controller as claimed in claim 4, in which at least one input of the fault detector is associated with a respective input detector which is responsive to at least one of:
   a) a mask/select control signal for determining whether an input signal at a signal input of the input detector should be taken into consideration by the fault detector; and
   b) an invert signal for causing an output signal from the input detector to be inverted with respect to the input signal.

8. A controller as claimed in claim 4, in which at least one input detector has multiple signal inputs and it is responsive to the order in which the signal inputs change.

9. A controller as claimed in claim 3, in which the fault detector includes combinational logic for combining its inputs in a logical OR.

10. A controller as claimed in claim 1 in which the logic core includes a combinational logic unit having a plurality on inputs and a single output, and wherein at least one of the inputs is selectively maskable and invertable such that the combinational logic unit can be arranged to look for the occurrence of a plurality of input signals being in a predetermined state, and to assert a first predetermined output signal when the input signals are in the predetermined state and a second predetermined output signal when the input signals are not in the predetermined state.

11. A controller as claimed in claim 1 in which the logic core comprises a sequence detector.

12. A controller as claimed in claim 11, wherein the sequence detector has a plurality of inputs and a lesser number of outputs.

13. A controller as claimed in claim 12, in which the sequence detector has a single output.

14. A controller as claimed in claim 12, in which the sequence detector comprises a multiplexer responsive to a selection control word to select only one of the plurality of inputs.

15. A controller as claimed in claim 11 in which the sequence detector includes a device arranged in a first mode to pass a signal to or from the multiplexer in a non-inverted state and in a second mode to invert the signal.

16. A controller as claimed in claim 11 in which the sequence detector further includes a sequence timer arranged to assert an output signal only when an input condition monitored by the sequence detector has been in a predetermined state for a predetermined period.

17. A controller as claimed in claim 16, in which the sequence timer is programmable.

18. A controller as claimed in claim 1, in which the logic core comprises a time out circuit having a time out timer selectively arranged to assert an output a predetermined period after the logic core has entered a state.

19. A controller as claimed in claim 18, in which the time out timer is programmable.

20. A controller as claimed in claim 1, in which the memory is programmable.

21. A controller as claimed in claim 20, in which the memory is user programmable.

22. A controller as claimed in claim 20 in which the memory is non-volatile.

23. A controller as claimed in claim 1, in which the memory holds data which is a state control word comprising a least one of the following items:
   a) output data defining the condition of at least one output upon entry into a state;
   b) data for controlling a fault detector, and in particular data defining whether an input of the fault detector is to be masked and data identifying the next state to be executed if a fault condition is determined by the fault detector, and
   c) data for controlling a sequence detector, and in particular data defining which input of the sequence detector is to be monitored and data identifying the next state to be executed if the sequence detector determines that a condition it is monitoring is satisfied.

24. A controller as claimed in claim 23, in which the memory further includes data for setting a duration timed by a time out timer and data identifying the next state to be executed after the time out timer has timed out and triggered a state change.

25. An integrated circuit including a controller as claimed in claim 1.

26. A method for controlling a plurality of power supplies, comprising:
   providing a logic core having a plurality of inputs and a plurality of outputs which supply signals for controlling said power supplies;
   providing a memory; and
   operating the logic core as a state machine and upon transition from a state to a succeeding state, modifying the operation of the logic core in accordance with data held in the memory, such that the inputs selected for monitoring by the logic core can be varied as the controller changes state.

27. The method of claim 26, wherein the logic core is operated to represent a state having up to three outputs.

28. The method of claim 26, further including operating the logic core to perform a fault detection function.

29. The method of claim 28, wherein the logic core, when operated as a fault detector, has a plurality of inputs and a lesser number of outputs.

30. The method of claim 29, in which the fault detector has a single output.

31. The method of claim 30 further including supplying a fault detector output to a device arranged in a first mode to pass the output of the fault detector in a non-inverted state and in a second mode to invert the output of the fault detector.

32. The method of claim 29, further comprising providing an input detector, associated with the logic core when it is operated as a fault detector, and which is responsive to at least one of:
   a. a mask/select control signal for determining whether an input signal at a signal input of the input detector should be taken into consideration by the fault detector; and
   b. an invert signal for causing an output signal from the input detector to be inverted with respect to the input signal.

33. The method of claim 29 in which at least one input detector has multiple signal inputs and is responsive to the order in which the signal inputs change.

34. The method of claim 28 wherein providing a fault detector includes providing combinational logic for combining its inputs in a logical OR function.

35. The method of claim 26, wherein providing the logic core includes providing a combinational logic unit therein having a plurality of inputs and a single output, at least one of the inputs being selectively maskable and invertable such that the combinational logic unit is configurable to look for the occurrence of a plurality of inputs in a predetermined state and to assert a first predetermined output signal when the input signals are in the predetermined state and the second predetermined output signal when the input signals are not in the predetermined state.

36. The method of claim 26 wherein providing the logic core includes providing a sequence detector.

37. The method of claim 36 wherein providing a sequence detector includes providing a sequence detector having a plurality of inputs and a lesser number of outputs.

38. The method of claim 37 wherein the sequence detector has a single output.

39. The method of claim 37 wherein the sequence detector comprises a multiplexor responsive to a selection control word to select only one of the plurality of inputs.

40. The method of claim 36 in which the sequence detector includes a device arranged in a first mode to pass the signal to or from the multiplexor in a non-inverted state and in a second mode to invert the signal.

41. The method of claim 36 in which the sequence detector further includes a sequence timer arranged to assert an output signal only when an input condition monitored by the sequence detector has been in a predetermined state for a predetermined period.

42. The method of claim 41 in which the sequence timer is programmable.

43. The method of claim 26 wherein providing a logic core includes providing a logic core comprising a time out circuit having a time out timer selectively arranged to assert an output a predetermined period after the logic core has entered a state.

44. The method of claim 43 in which the time out time is programmable.

45. The method of claim 26 in which the memory is programmable.

46. The method of claim 45 in which the memory is user programmable.

47. The method of claim 45 in which the memory is non-volatile.

48. The method of claim 26 wherein the memory is adapted to hold data which is a state control word comprising at least one of the following items:
  a. output data defining the condition of at least one output upon entry into a state;
  b. data for controlling a fault detector, and in particular data defining whether an input of the fault detector is to be masked and data identifying the next state to be executed if a fault condition is determined by the fault detector, and
  c. data for controlling a sequence detector, and in particular data defining which input of the sequence detector is to be monitored and data identifying the next state to be executed if the sequence detector determines that a condition it is monitoring is satisfied.

49. The method of claim 48 wherein the memory further is adapted to include data for setting a duration timed by a time out timer and data identifying the next state to be executed after the time out timer has timed out and triggered a state change.

* * * * *